(12) United States Patent
Asakura et al.

(10) Patent No.: US 12,014,909 B2
(45) Date of Patent: Jun. 18, 2024

(54) PLASMA PROCESSING APPARATUS AND PLASMA PROCESSING SYSTEM

(71) Applicant: Hitachi High-Tech Corporation, Tokyo (JP)

(72) Inventors: Ryoji Asakura, Tokyo (JP); Shota Umeda, Tokyo (JP); Daisuke Shiraishi, Tokyo (JP); Akira Kagoshima, Tokyo (JP); Satomi Inoue, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 669 days.

(21) Appl. No.: 16/950,179

(22) Filed: Nov. 17, 2020

(65) Prior Publication Data

US 2021/0074528 A1 Mar. 11, 2021

Related U.S. Application Data

(62) Division of application No. 15/892,041, filed on Feb. 8, 2018, now Pat. No. 10,872,750.

(30) Foreign Application Priority Data

Aug. 8, 2017 (JP) .................. 2017-152921

(51) Int. Cl.
*H01J 37/32* (2006.01)
*G01J 3/443* (2006.01)
*H01L 21/67* (2006.01)

(52) U.S. Cl.
CPC ......... *H01J 37/32926* (2013.01); *G01J 3/443* (2013.01); *H01L 21/67069* (2013.01); *H01L 21/67253* (2013.01); *H01J 2237/334* (2013.01)

(58) Field of Classification Search
CPC .......... H01J 37/32926; H01J 2237/334; G01J 3/443; H01L 21/67253; H01L 21/67069
See application file for complete search history.

(56) References Cited

U.S. PATENT DOCUMENTS

| 5,170,367 | A  | 12/1992 | Mackay et al. |
| 7,138,156 | B1 | 11/2006 | Myrick et al. |
| 8,828,184 | B2 | 9/2014  | Kagoshima et al. |

(Continued)

FOREIGN PATENT DOCUMENTS

| JP | 2013-105923 A | 5/2013 |
| JP | 2013-161913 A | 8/2013 |

(Continued)

OTHER PUBLICATIONS

Office Action dated Dec. 17, 2018 in corresponding Korean Application No. 10-2017-0180655.

(Continued)

*Primary Examiner* — Yuechuan Yu
(74) *Attorney, Agent, or Firm* — Miles & Stockbridge, P.C.

(57) ABSTRACT

The plasma processing apparatus includes a plasma processing unit that performs plasma processing of a sample and a control unit that controls the plasma processing. The control unit selects one of a plurality of the prediction models for predicting a result of the plasma processing based on a state of the plasma processing unit, and predicts the result of the plasma processing by using a selected prediction model.

1 Claim, 15 Drawing Sheets

(56) References Cited

U.S. PATENT DOCUMENTS

| | | | |
|---|---|---|---|
| 2004/0045934 A1 | 3/2004 | Harvey et al. | |
| 2005/0016947 A1 | 1/2005 | Fatke et al. | |
| 2005/0143952 A1 | 6/2005 | Tomoyasu et al. | |
| 2005/0146709 A1 | 7/2005 | Oh et al. | |
| 2007/0231930 A1 | 10/2007 | Funk et al. | |
| 2009/0081815 A1 | 3/2009 | Yamashita et al. | |
| 2009/0211706 A1 | 8/2009 | Uchida et al. | |
| 2011/0083808 A1* | 4/2011 | Kagoshima | H01J 37/32935 156/345.24 |
| 2012/0091097 A1 | 4/2012 | Chen et al. | |
| 2014/0277626 A1 | 9/2014 | Kagoshima et al. | |
| 2015/0004721 A1 | 1/2015 | Akimoto et al. | |
| 2015/0140692 A1 | 5/2015 | Tsai et al. | |
| 2016/0020123 A1 | 1/2016 | Asakura et al. | |
| 2016/0225681 A1 | 8/2016 | Asakura et al. | |
| 2016/0379896 A1 | 12/2016 | Asakura et al. | |

FOREIGN PATENT DOCUMENTS

| | | |
|---|---|---|
| JP | 2016-25145 A | 2/2016 |
| KR | 20090092677 A | 9/2009 |
| KR | 10-2011-0039167 A | 4/2011 |
| KR | 20140119066 A | 10/2014 |
| KR | 10-2016-0094251 A | 8/2016 |

OTHER PUBLICATIONS

E. Sachs, et al. "Run by Run Process Control: Combining SPC and Feedback Control", IEEE Transactions on Semiconductor Manufacturing, vol. 8, No. 1 (Feb. 1995) pp. 26-43.

* cited by examiner

FIG. 4

PREDICTION MODEL SWITCHING TABLE 16-1a

| APPARATUS STATE MANAGEMENT ITEM | JUDGMENT CRITERION | PREDICTION MODEL ID |
|---|---|---|
| H5 | H5<100 | PREDICTION MODEL 1 |
|  | H5≧100 | PREDICTION MODEL 2 |
| ... | ... | ... |

(columns: 16-1b, 16-1c, 16-1d)

PREDICTION MODEL TABLE 16-2a

| PREDICTION MODEL ID | WAVELENGTH | CALCULATION FORMULA |
|---|---|---|
| PREDICTION MODEL 1 | W3 | 0.31 + 0.22 * monitor(W3) |
| PREDICTION MODEL 2 | W3 | 0.42 + 0.23 * monitor(w3) |
| ... | ... | ... |

(columns: 16-2b, 16-2c, 16-2d)

| WAFER ID | SPECTRAL MONITOR VALUE | | | APPARATUS STATE MANAGEMENT ITEM VALUE | | | PROCESSING RESULT INDEX |
|---|---|---|---|---|---|---|---|
| | W1 | ... | Wk | H1 | ... | Hn | |
| R1 | 80.6 | ... | 79.0 | 102 | ... | 35 | 1.8 |
| R2 | 79.5 | ... | 79.4 | 130 | ... | 48 | 1.9 |
| ... | ... | ... | ... | ... | ... | ... | ... |
| R500 | 81.5 | ... | 80.5 | 201 | ... | 92 | 2.5 |

| WAVELENGTH | APPARATUS STATE MANAGEMENT ITEM | JUDGMENT CRITERION THRESHOLD | DETERMINATION COEFFICIENT | ROBUSTNESS EVALUATION | INTER-DISTRIBUTION DISTANCE EVALUATION | COEFFICIENT EVALUATION |
|---|---|---|---|---|---|---|
| W1 | H1 | H1_T1 | 0.46 | × | × | × |
| W1 | H1 | ... | ... | ... | ... | ... |
| W1 | H1 | H1_Tm | 0.53 | ○ | ○ | ○ |
| W1 | H2 | H2_T1 | 0.78 | ○ | ○ | ○ |
| W1 | H2 | ... | ... | ... | ... | ... |
| W1 | H2 | H2_Tm | 0.82 | × | ○ | ○ |
| ... | ... | ... | ... | ... | ... | ... |
| WK | Hn | Hn_Tm | 0.3 | × | ○ | ○ |

24b, 24c, 24d, 24e, 24f, 24g, 24h

FIG. 9
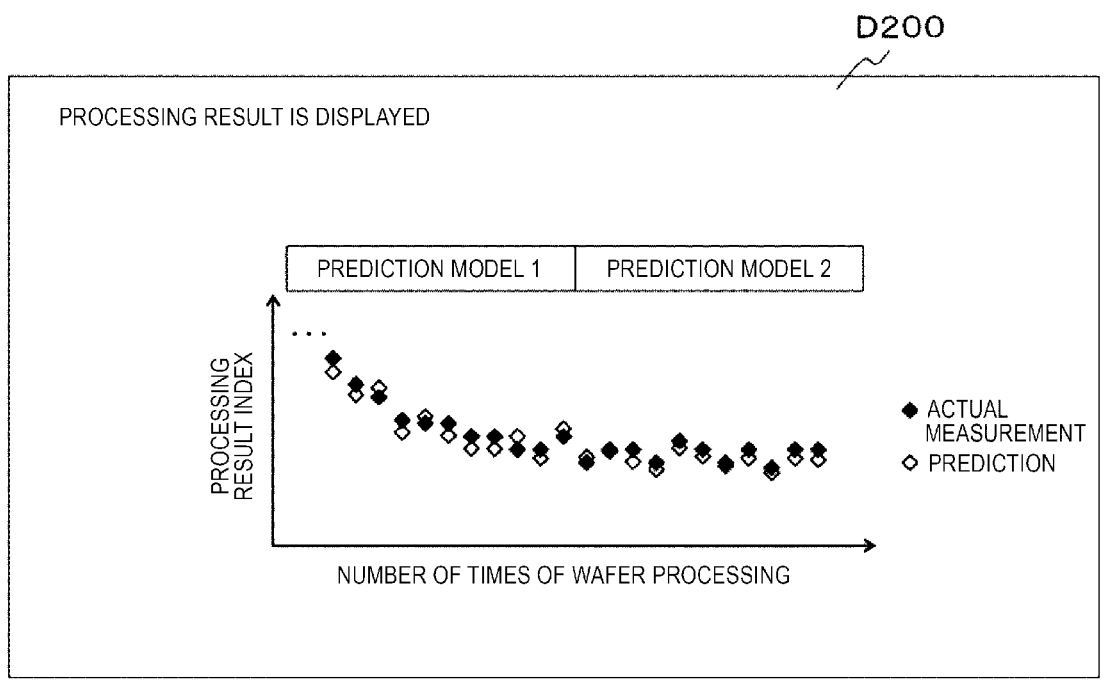
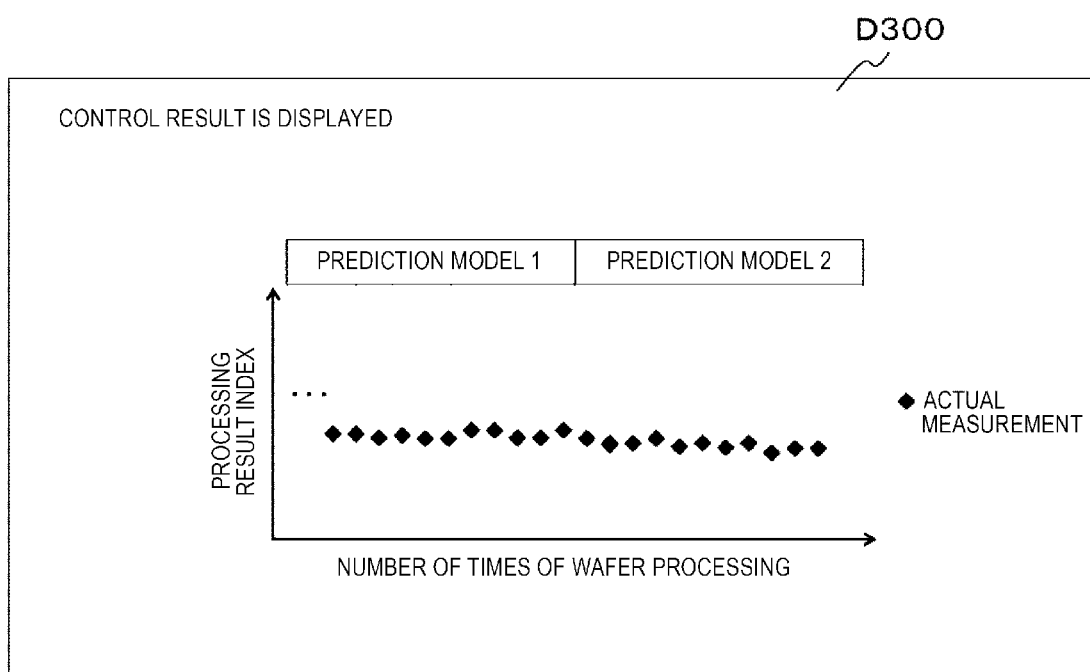

FIG. 11

RESULT OF ANALYSIS PROCESSING AND PREDICTION MODEL ARE CREATED AS FOLLOWS

D501

SWITCHING ITEM

| APPARATUS STATE MANAGEMENT ITEM | JUDGMENT THRESHOLD | PREDICTION MODEL ID |
|---|---|---|
| H5 | H5<100 | PREDICTION MODEL 1 |
| H5 | H5≥100 | PREDICTION MODEL 2 |

D503

IS APC PERFORMED BY USING PREDICTION MODEL?

[ Yes ]   [ No ]

D502

PREDICTION MODEL

| PREDICTION MODEL ID | WAVELENGTH | CALCULATION FORMULA |
|---|---|---|
| PREDICTION MODEL 1 | W3 | 0.31 + 0.22 * monitor(W3) |
| PREDICTION MODEL 2 | W3 | 0.42 + 0.23 * monitor(w3) |

PLASMA PROCESSING APPARATUS AND PLASMA PROCESSING SYSTEM

BACKGROUND OF THE INVENTION

Field of the Invention

The present invention relates to a plasma processing apparatus and a plasma processing system.

Background Art

In a plasma processing apparatus, in order to obtain a fine shape of a semiconductor device or the like formed on a semiconductor wafer, plasma processing, in which a substance is in an ionized state (plasma state) and the substance on the wafer is removed by an operation (reaction on a wafer surface) of the substance, is performed.

Here, dimensions such as a width and a depth of the fine shape of the semiconductor device, and a machining speed (etch rate) when the plasma processing apparatus machines the fine shape are called processing result indices.

In the plasma processing apparatus, it is difficult to obtain the same processing result index due to various disturbances and a temporal change of the plasma state even when processing is performed under the same plasma processing condition. Therefore, in order to stabilize the processing result index, a control technique, which predicts the processing result index using monitor data of the apparatus measured during etching and changes the plasma processing condition based on a predicted result, is applied to the plasma processing apparatus. As the monitor data, data obtained by measuring light emission by plasma, a reflected light on the semiconductor wafer surface, or the like during plasma processing with a spectroscope (hereinafter, referred to as spectroscopic data) is used.

A method for predicting and controlling the processing result index using the spectroscopic data is described in, for example, JP-A-2016-25145. In JP-A-2016-25145, prediction and control are performed by selecting a wavelength suitable for prediction of a machining dimension from multiple wavelengths of the spectroscopic data.

SUMMARY OF THE INVENTION

In JP-A-2016-25145, the processing result index is predicted by utilizing the fact that there is a correlation between the spectroscopic data and the processing result index, and using a prediction model which is a single function in which the spectroscopic data is input.

However, in JP-A-2016-25145, since the single prediction model is used, in a case where the correlation between the spectroscopic data and the processing result index is changed by a change in a state of the plasma processing apparatus, it cannot follow the change and prediction accuracy decreases.

An object of the invention is to accurately predict a processing result index following a change in a state of a plasma processing apparatus.

According to an aspect of the invention, there is provided a plasma processing apparatus including: a plasma processing unit that performs plasma processing of a sample; and a control unit that controls the plasma processing. The control unit selects one of a plurality of prediction models for predicting a result of the plasma processing based on a state of the plasma processing unit, and predicts a result of the plasma processing using the selected prediction model.

According to another aspect of the invention, there is provided a plasma processing system including a plasma processing unit that performs plasma processing of a sample; and a processing unit that includes a control unit that controls the plasma processing and an apparatus state management unit that holds a management value indicating a state of the plasma processing unit. The plasma processing unit and the processing unit are connected via a network. The control unit selects one of a plurality of prediction models for predicting a result of the plasma processing based on a threshold of the management value. A result of the plasma processing is predicted using the selected prediction model.

According to one aspect of the invention, it is possible to accurately predict a processing result index following a change in a state of the plasma processing apparatus.

BRIEF DESCRIPTION OF THE DRAWINGS

FIG. 4 is a table illustrating an example of a prediction model storage region.

FIG. 6 is a table illustrating an example of a processing history storage region.

FIG. 7 is a table illustrating an example of an evaluation result storage region.

FIG. 9 is a view illustrating an example of a screen for displaying a result of prediction and control processing for switching the prediction model.

FIG. 11 is a view illustrating an output screen of the analysis processing of the data analysis device.

DETAILED DESCRIPTION OF THE INVENTION

Hereinafter, an example will be described with reference to the drawings.

Plasma Processing Apparatus

A configuration of a plasma processing apparatus 1 will be described with reference to FIG. 1.

Figure 1:
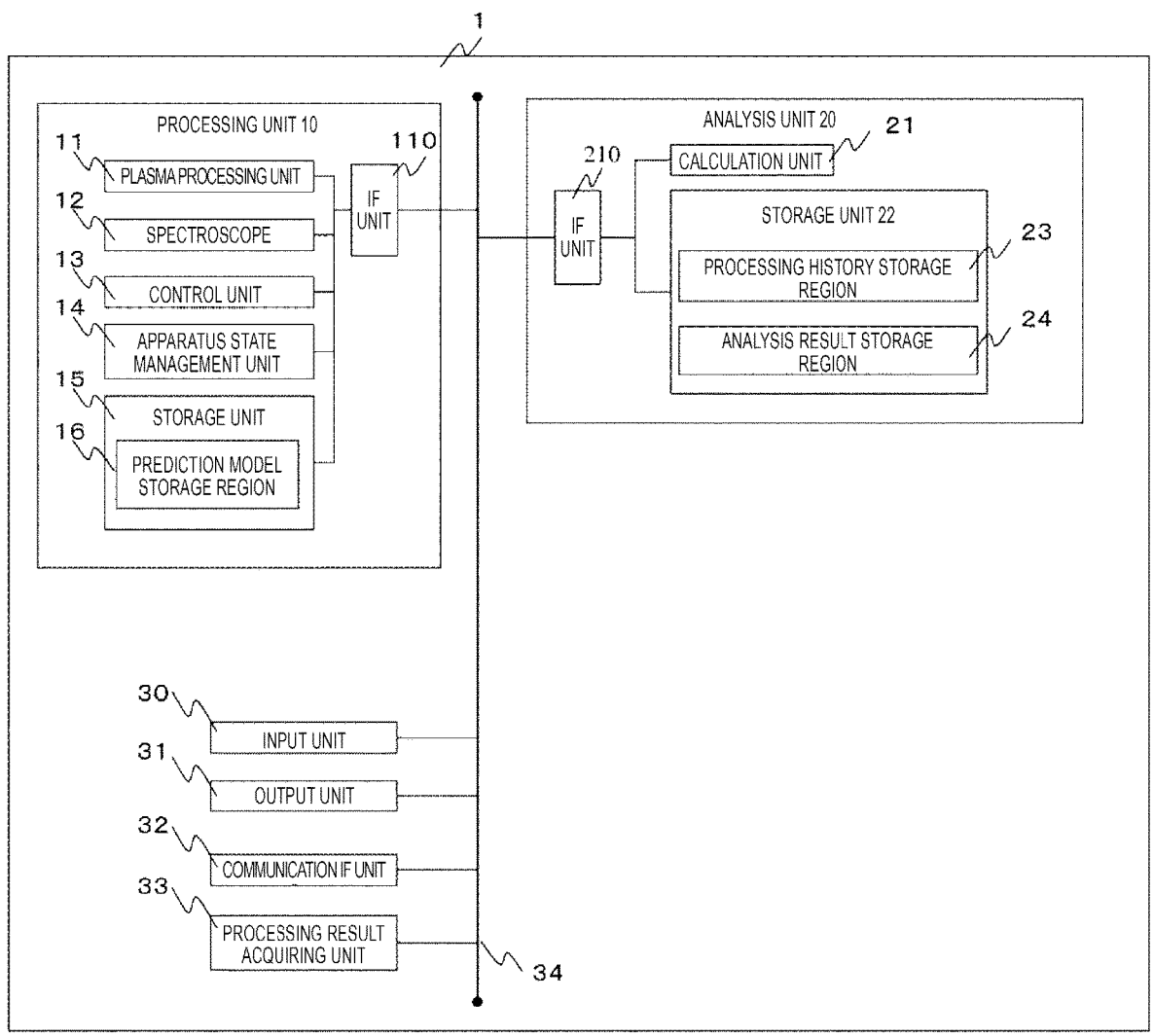
FIG. 1 is a block diagram illustrating a schematic configuration of a plasma processing apparatus of an example.

As illustrated in FIG. 1, the plasma processing apparatus 1 includes a processing unit 10, an analysis unit 20, an input unit 30, an output unit 31, a communication interface unit (communication IF unit) 32, and a processing result acquiring unit 33, which are connected to each other via a bus 34.

The processing unit 10 includes a plasma processing unit 11, a spectroscope 12, a control unit 13, an apparatus state management unit 14, a storage unit 15, an interface unit (IF unit) 110. The plasma processing unit 11 generates plasma to process a wafer (sample) and the spectroscope 12 acquires light emission data of plasma and the spectroscopic data that is a reflected light on a wafer surface or an inner wall surface of the plasma processing unit 11 while plasma processing is performed. The spectroscopic data is stored in a storage unit 22 included in the analysis unit 20 via an IF unit 210.

The control unit 13 controls processing in the plasma processing unit 11. The control unit 13 predicts a processing result index of plasma processing using a prediction model which is described later and performs prediction and control processing (APC: Advanced Process Control) for adjusting a plasma processing condition. Information specifying the prediction model is stored in the prediction model storage region 16 of a storage unit 15.

The analysis unit 20 performs processing for specifying an apparatus state management item and a judgment criterion thereof used for switching the prediction model. The analysis unit 20 includes a calculation unit 21 that analyzes data, the storage unit 22, the interface unit (IF unit) 210.

The storage unit 22 includes a processing history storage region 23 indicating a result of past plasma processing and an analysis result storage region 24 indicating a result of past analysis processing.

The calculation unit 21 performs analysis processing which determines the apparatus state management item and a judgment criterion thereof using the processing history storage region 23. Details of analysis processing performed by the calculation unit 21 will be described later.

The input unit 30 is, for example, a mouse, a keyboard, or the like that accepts information input by a user operation. The output unit 31 is a display, a printer, or the like that outputs information to the user. The communication IF unit 32 is an interface for connecting to another device and system (which can also be connected to an existing production management system or the like) via the bus 34, an external network, or the like, and performing information transmission and reception.

The bus 34 connects each of the units (10, 20, 30, 31, 32, and 33). The IF units (110 and 210) of each unit are interfaces for performing information transmission and reception via the bus 34. The processing result acquiring unit 33 is an interface for acquiring the processing result index from an inspection device that measures the processing result index or the like. Moreover, the analysis unit 20 may be configured to be independent as an analysis device and connected to the plasma processing apparatus including the plasma processing unit 10 via the IF unit 210.

Plasma Processing Unit

Figure 2:
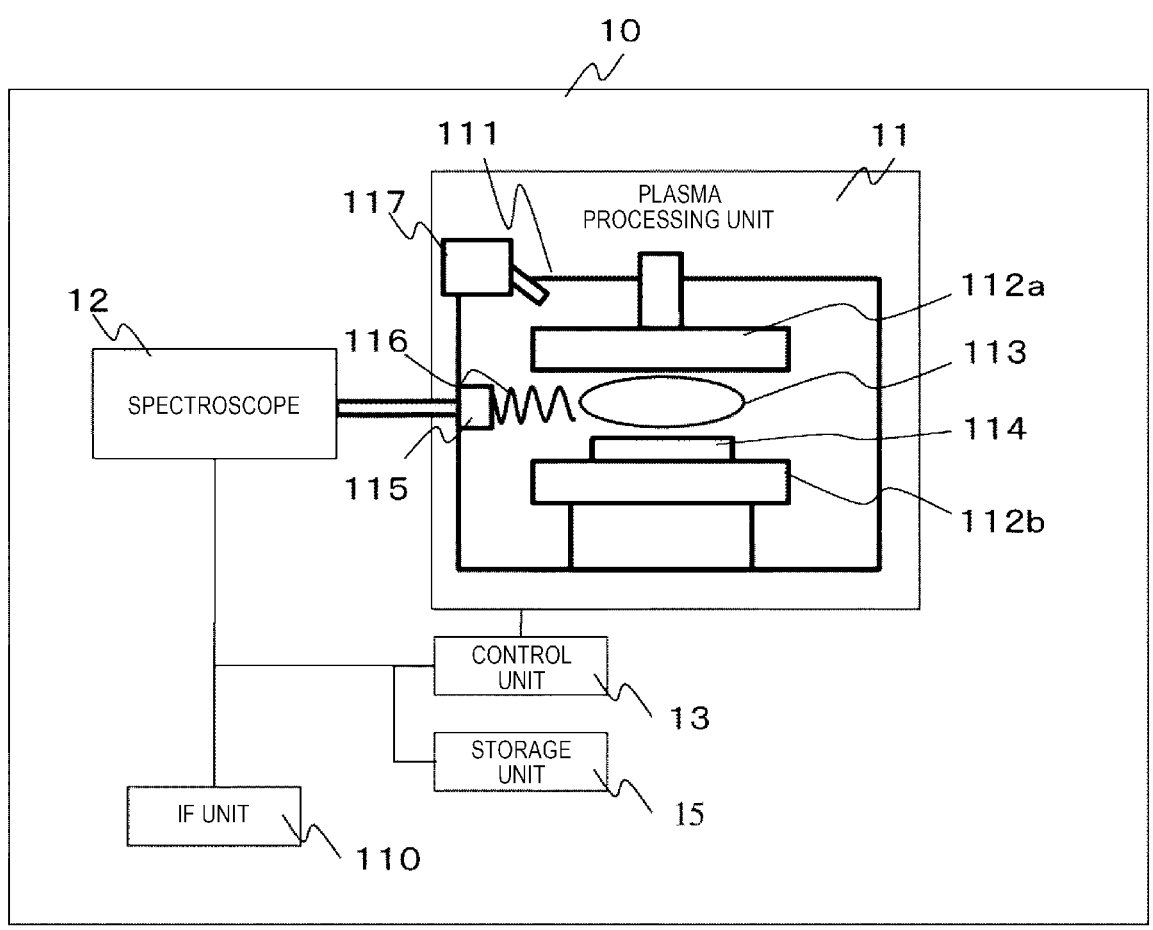
FIG. 2 is a block diagram illustrating a schematic configuration of a processing unit of the plasma processing apparatus.

The processing unit 10 includes the plasma processing unit 11, the spectroscope 12, the control unit 13, the storage unit 15, and the IF unit 110. As illustrated in FIG. 2, the plasma processing unit 11 includes a chamber 111 which is evacuated to a vacuum by a vacuum evacuation unit (not illustrated), a pair of electrodes 112a and 112b that generates plasma on the inside of the chamber 111 which is evacuated to the vacuum by applying radio frequency power by power supply (not illustrated), a window 115 for observing the inside of the chamber 111 from the outside, and a gas supplier 117 that supplies plasma processing gas for plasma processing a wafer (sample) 114 to the inside of the chamber 111 which is evacuated to the vacuum. Moreover, the gas supplier 117 can supply a plurality of types of gas (CF4, CHF3, Ar, and the like) respectively.

In such a configuration, in accordance with an instruction from the control unit 13, the plasma processing unit 11 supplies the plasma processing gas from the gas supplier 117 and applies radio frequency power to the electrodes 112a and 112b by power supply in a case where the wafer 114 is stored in the chamber 111 and the inside of the chamber 111 is evacuated to the vacuum by an evacuation unit. Therefore, the plasma processing gas is converted into plasma between the electrodes 112a and 112b. The wafer 114 is machined by chemically and physically reacting a plasmatized gas 113 with the wafer 114.

The plasmatized gas 113 contains an element included in the plasma processing gas supplied from the gas supplier 117 and an element generated from the wafer 114 during machining, and generates a light 116 having a wavelength according to the elements contained in the plasmatized gas 113. The generated light 116 is measured by the spectroscope 12 through the window 115 and is stored in the processing history storage region 23 of the storage unit 22 of the analysis unit 20 via the IF unit 110. Moreover, a wall surface of the chamber 111 and the wafer 114 may be irradiated with light by using an external light source (not illustrated) and a reflected light and a transmitted light thereof may be measured by the spectroscope 12. In this case, spectroscopic data corresponding to a state of the plasma-processed wafer 114 and the wall surface of the chamber 111 can be obtained.

In addition to the instruction to the plasma processing unit 11, the control unit 13 performs processing of changing a plasma processing condition with the spectroscopic data measured by the spectroscope 12 as an input.

The apparatus state management unit 14 measures or holds the number of times (for example, the number of times of plasma processing of the wafer 114) of plasma processing from cleaning and a standby time of the plasma processing unit 11 as a state of the plasma processing unit 11. Here, apparatus state management by the apparatus state management unit 14 is, for example, to manage the state of the plasma processing unit 11. Values of these data are not only used for prediction and control processing but also stored in the processing history storage region 23 of the storage unit 22 of the analysis unit 20 via the IF unit 110.

The storage unit 15 stores a prediction model for calculating a predicted value of the processing result index, the apparatus state management item and the judgment criterion used for switching the prediction model. These pieces of information are stored in the prediction model storage region 16.

An example of the prediction model storage region 16 will be described with reference to FIG. 4.

As illustrated in FIG. 4, the prediction model storage region 16 is configured of a prediction model switching table 16-1a and a prediction model table 16-2a. The prediction model switching table 16-1a stores the apparatus state management item (apparatus state management item section 16-1b) and the judgment criterion (judgment criterion section 16-1c) used for switching the prediction model, and a prediction model ID (prediction model ID section 16-1d) in a case where each judgment criterion is met.

The prediction model table 16-2a stores a prediction model ID (prediction model ID section 16-2b), a wavelength (wavelength section 16-2c) of the spectroscopic data used for the prediction model, and a calculation formula (calculation formula section 16-2d) for calculating the processing result index from the spectroscopic data. The calculation formula is a form in which the processing result index is calculated with an average value of a light emission intensity of the spectroscopic data in the wavelength 16-2c as an input. Hereinafter, the average value of the light emission intensity of the spectroscopic data is referred to as a spectral monitor value.

Figure 16:
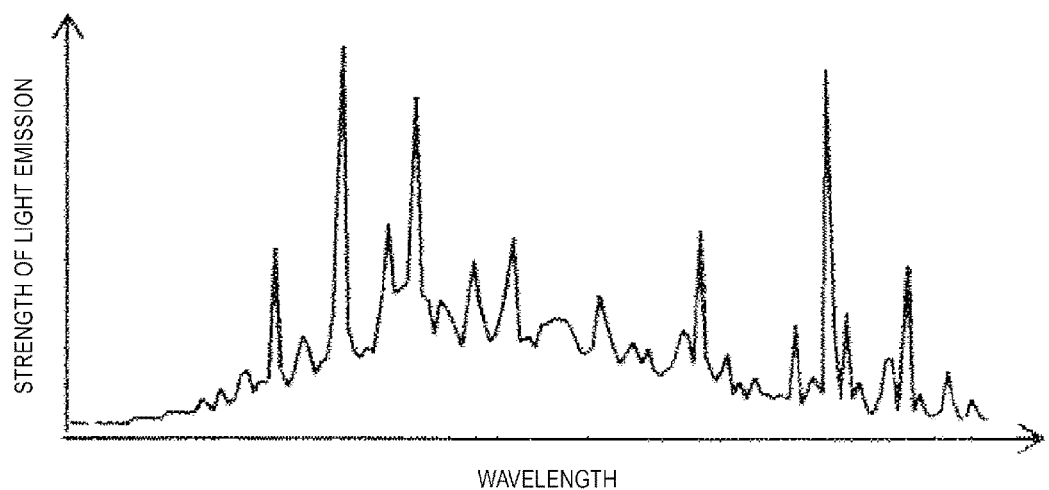
FIG. 16 is a graph illustrating an example of spectroscopic data measured by a spectroscope.

Here, an example of the spectroscopic data measured by the spectroscope 12 is illustrated in FIG. 16. The spectroscopic data represents a value of the light emission intensity measured for each wavelength.

After completion of plasma processing, the processed wafer 114 is taken out from the chamber 111 and transferred to another device (inspection device or the like). Another new wafer 114 is stored in the plasma processing unit 11 and plasma processing is performed. In the processed wafer 114, a dimension of a shape of a pattern obtained as a result of plasma processing in another device (inspection device or the like) or the like is measured. The dimension of the shape or the like is stored in the processing history storage region 23 of the storage unit 22 via the processing result acquiring unit 33 as the data of the processing result index.

Prediction and Control Processing (APC)

Figure 3:
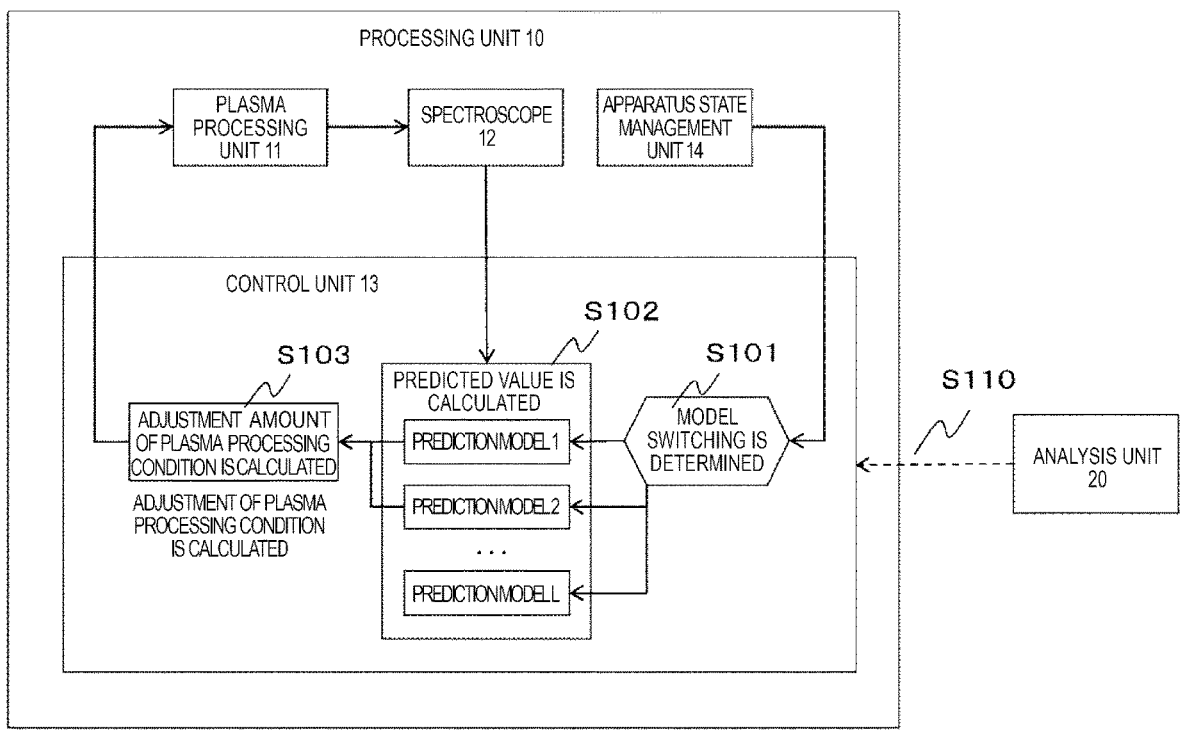
FIG. 3 is a diagram of a configuration for explaining prediction and control processing of a control unit.

An example of processing of the APC performed by the control unit 13 will be described with reference to FIG. 3. When plasma processing of the wafer 114 is completed, in a case where the APC is set to be performed, the control unit 13 performs judgment of prediction model switching (S101).

In S101, data of the apparatus state management item is acquired from the apparatus state management unit 14 and for the judgment criterion section 16-1c of the prediction model switching table 16-1a, a row that satisfies the criterion is specified and information of the corresponding prediction model ID section 16-1d is specified as the prediction model used for the prediction.

Furthermore, the control unit 13 predicts the processing result index using the specified prediction model and the spectroscopic data (S102). In S102, for the specified prediction model, information of a wavelength used for the prediction is acquired from the wavelength section 16-2c of the prediction model table 16-2a. The predicted value of the processing result index is calculated by calculating a spectral monitor value of the wavelength from the spectroscopic data and substituting the spectral monitor value into a calculation formula specified in the calculation formula section 16-2d. Moreover, a maximum value, a minimum value, or a median value of the light emission intensity may be used as the spectral monitor value. In addition, a light emission wavelength of the elements (Ar and Si) contained in the plasma can be used as the wavelength. In addition, in a case where the intensity of the light reflected from the wafer 114 and the wall surface of the chamber 111 is used, wavelengths having different intensities can be used according to states of the wafer 114 and the wall surface of the chamber 111. In addition, a ratio of the light emission intensity in a plurality of the wavelengths may be used.

Next, the control unit 13 calculates the predicted value of the processing result index by multiplying the spectral monitor value by a coefficient designated by the prediction model stored in the storage unit 15 (S102).

Furthermore, the control unit 13 adjusts the plasma processing condition according to a difference between the predicted value of the processing result index and a target value (S103). As the plasma processing condition, for example, a flow rate (gas flow rate) of the plasma processing gas supplied from the gas supplier 117 is adjusted. In addition, in S103, in addition to adjusting the plasma processing condition, in a case where the difference between the predicted value of the processing result index and the target value is greater than a predetermined threshold, an alarm may be output as an abnormality. In addition, a configuration in which the predicted value of the processing result index is output may be provided for an apparatus after the plasma processing apparatus without adjusting the plasma processing condition.

Screen of Prediction (APC) and Control Processing

In a case where the prediction and control processing is performed, in a step before plasma processing on a plurality of the wafers 114 is sequentially performed using the plasma processing apparatus 1 in a production step, it is necessary to input the calculation formula of the apparatus state management item, the judgment criterion, and the prediction model in advance used for switching the prediction model by an apparatus administrator.

Figure 8:
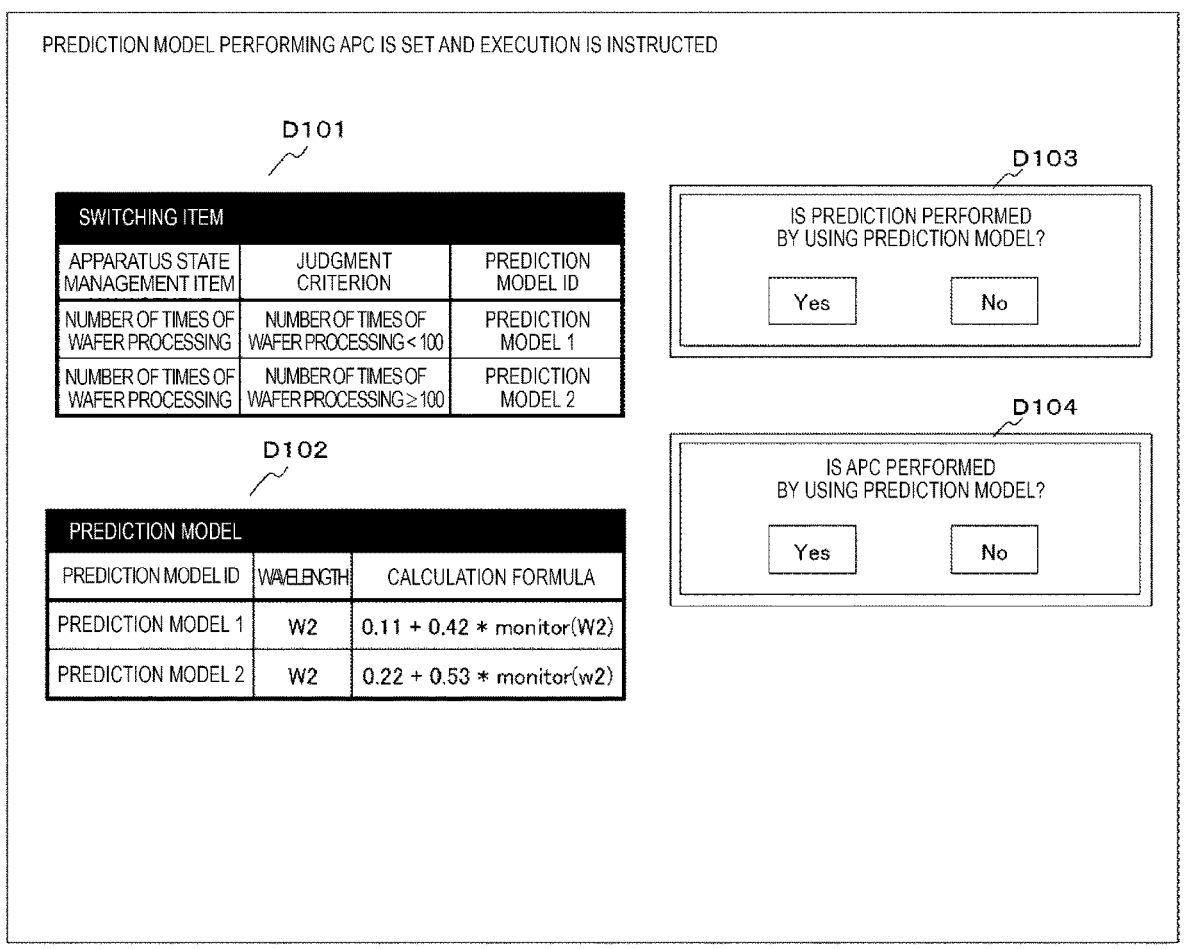
FIG. 8 is a view illustrating a screen for inputting setting of prediction and control processing for switching a prediction model.

An example of an input screen D100 by the apparatus administrator will be described with reference to FIG. 8.

The apparatus administrator inputs the apparatus state management item and the judgment criterion used for switching the prediction model in a switching item section D101 and inputs the calculation formula of the wavelength and the prediction model used for the calculation of the spectral monitor value in a prediction model section D102. After the input, in a case where only prediction is performed, it is instructed in D103 and in a case where the APC is performed, it is instructed in D104.

An example of a screen indicating a result of the prediction and the APC will be described with reference to FIG. 9.

An example of a case where only the prediction is performed is D200. Here, an actually measured value and the predicted value of the processing result index are displayed together. In addition, the prediction model used for the prediction is displayed for the corresponding section. For example, in a case where a trend of a change of the processing result index due to the change in the apparatus state is different between a first half and a second half of the number of times of processing of the wafer 114 as in this case, it is possible to improve prediction accuracy by using different prediction models in the first half and the second half. For example, as illustrated in FIG. 9, a prediction model 1 is used in the first half and a prediction model 2 is used in the second half.

An example of a case where the APC is performed is D300. Here, an actually measured value of the processing result index and a prediction model used for the prediction are displayed. It is possible to improve the prediction accuracy as being indicated by D200 and it is also possible to reduce variation of a control result as indicated by the result D300 by switching the prediction model in accordance with the change in the apparatus state. Setting of the APC is created from a past processing history in analysis processing of the analysis unit 20 performed next.

Analysis Unit

As illustrated in FIG. 1, the analysis unit 20 includes the calculation unit 21, the storage unit 22, and the IF unit 210. The storage unit 22 includes the processing history storage region 23 and the analysis result storage region 24. The processing history storage region 23 stores information of specifying the spectral monitor value measured by the spectroscope 12 during the plasma processing, a value of the apparatus state management item in this case, and a value of the processing result index measured by a measuring device for each wafer in which plasma processing is performed.

FIG. 6 illustrates a processing history data table 23a that is an example of the processing history storage region 23. The table includes each of fields of a wafer ID section 23b, a spectral monitor value section 23c, an apparatus state management item value section 23d, a processing result index section 23e, and the like.

The wafer ID section 23b stores information of specifying the wafer 114. The spectral monitor value section 23c stores information specifying spectroscope measurement data measured by the spectroscope 12. As illustrated in FIG. 6, the spectral monitor value section 23c has fields divided for each wavelength and a value obtained by averaging the light emission intensities in a plasma processing time in each wavelength is stored in each of the fields. In addition, each row corresponds to the ID of the wafer of which the spectroscopic data is measured.

The stored spectroscopic data may be spectroscopic data obtained when plasma processing is performed to machine the wafer 114, or may be spectroscopic data obtained when plasma processing is performed to prepare the state of the plasma processing unit 11 before the wafer 114 is machined.

In addition, the light emission wavelength of the elements (Ar and Si) contained in plasma is stored for each wavelength. In addition, in a case where intensity of the light reflected from the wafer 114 and the wall surface of the chamber 111 is used, wavelengths different in intensity by the state of the wafer 114 and the wall surface of the chamber 111 are stored. In addition, a ratio of the light emission intensity in a plurality of the wavelengths may be used.

In addition, the stored value may not be the average value of the light emission intensity in the plasma processing time, but may be the maximum value, the minimum value, or the median value, or may be a value of the light emission intensity in a certain designated time such as a value of the light emission intensity at an intermediate time point of the plasma processing.

The apparatus state management item value section 23d stores information specifying a management value and a measurement value of the apparatus state management unit 14 when processing of each wafer is performed. As illustrated in FIG. 6, the apparatus state management item value section 23d has fields divided for each management item and stores the corresponding management item value. As the management item, for example, the number of times of plasma processing from cleaning, a standby time from the previous plasma processing, or the like is used.

The processing result index section 23e stores information specifying a result of the plasma processing. For example, the processing result index section 23e stores a result (for example, a dimension of a pattern formed on the wafer 114 measured by the measuring device such as a length measurement SEM or an optical measuring device, a dimension between patterns, or the like) of measuring a surface shape of the wafer 114 specified in the wafer ID section 23b by using the measuring device connected to the plasma processing apparatus 1 after the plasma processing. Dimension information of the surface shape for each wafer 114 is stored in the processing result index section 23e via the processing result acquiring unit 33.

In addition, in a case where the plasma processing condition is adjusted for each wafer 114, a change amount of the processing result index by an adjustment amount of the plasma processing condition is calculated by using a function between an adjustment amount of the plasma processing condition and a change amount of the processing result index, and a value obtained by correcting the measured processing result index with the change amount of the processing result index may be stored in the processing result index section 23e.

FIG. 7 illustrates an analysis result data table 24a that is an example of the analysis result storage region 24. The table includes each of fields of a wavelength section 24b, an apparatus state management item section 24c, a judgment criterion threshold section 24d, a determination coefficient section 24e, a robustness evaluation section 24f, an inter-distribution distance evaluation section 24g, a coefficient evaluation section 24h, and the like.

Values stored in the wavelength section 24b, the apparatus state management item section 24c, and the judgment criterion threshold section 24d indicate a wavelength for calculating the spectral monitor value of the prediction model, the apparatus state management item for switching the prediction model, and a threshold of a judgment criterion of switching, respectively.

In addition, values stored in the judgment criterion threshold section 24d, the determination coefficient section 24e, the robustness evaluation section 24f, the inter-distribution distance evaluation section 24g, and the coefficient evaluation section 24h store information for specifying whether or not a combination of the wavelength section 24b, the apparatus state management item section 24c, and the judgment criterion threshold section 24d in the previous term is acceptable. The values of the data table are stored in analysis processing which is described later.

Analysis Processing of Analysis Unit 20

Analysis processing according to an example specifies the apparatus state management item and the threshold of the judgment criterion used for switching the prediction model that predicts the processing result index in plasma processing of machining the wafer 114 by using plasma.

The analysis processing according to the example evaluates a strength of a correlation between the spectral monitor value of the wavelength and the processing result index, and robustness, or the like for each combination of the wavelength of the spectroscopic data, the apparatus state management item, and the threshold of the judgment criterion. Therefore, the apparatus state management item and the threshold of the judgment criterion used for switching the prediction model are specified.

Hereinafter, a method of analysis processing according to the example will be described in detail.

As a step before plasma processing on the plurality of the wafers 114 is sequentially performed using the plasma processing apparatus 1 in the production step, the apparatus administrator handling the plasma processing apparatus 1 executes the analysis processing in the analysis unit 20 in order to create the apparatus state management item, the threshold of the judgment criterion, and the prediction model used for the prediction.

The prediction model and a switching condition thereof change depending on a configuration of a film on the surface of the wafer 114 that is a target of the plasma processing. Therefore, it is necessary to appropriately execute the analysis processing when the plasma processing is started.

Figure 5:
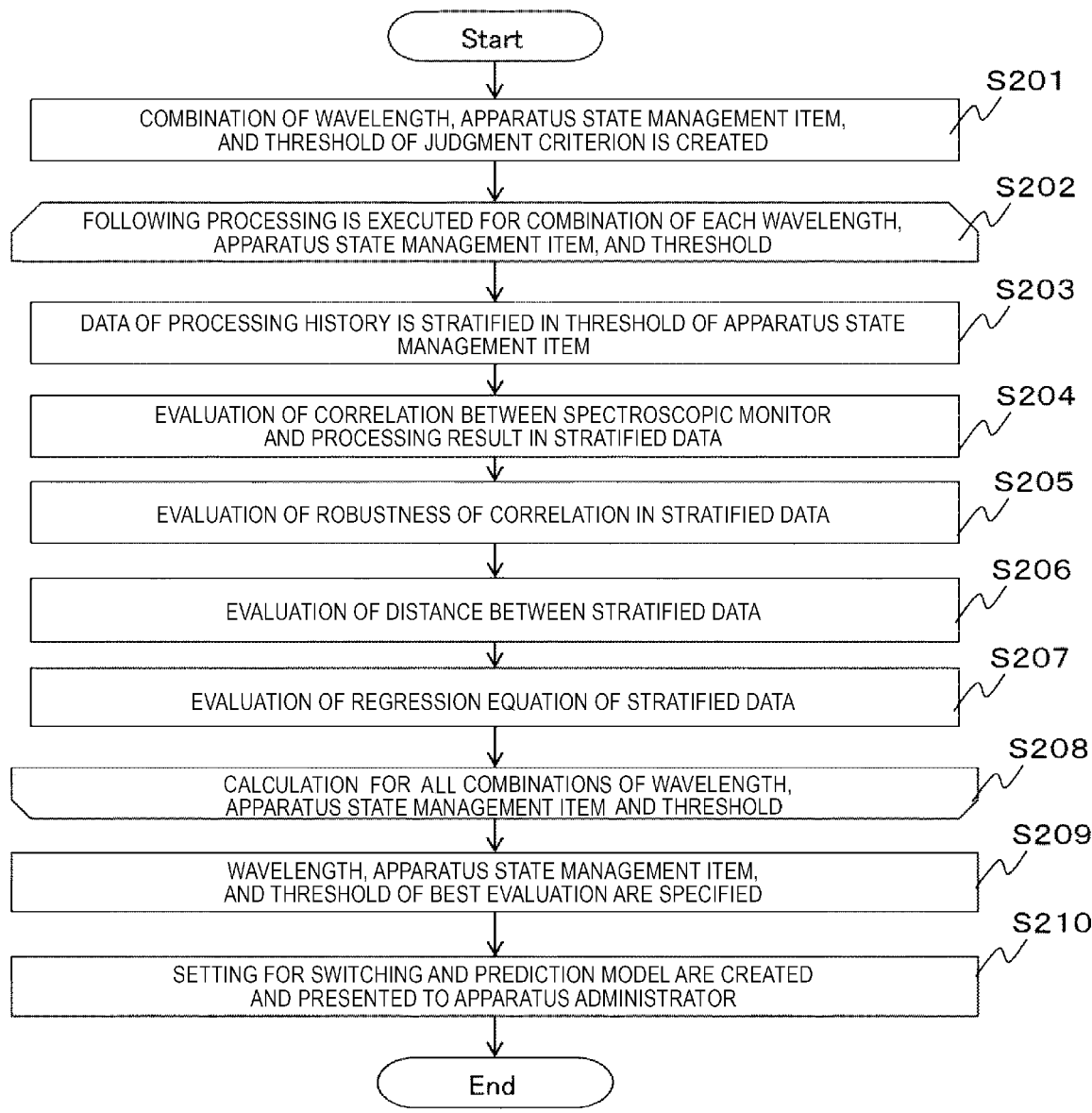
FIG. 5 is a flowchart illustrating an analysis processing of a data analysis device.

Next, a flow of the analysis processing executed in the analysis unit 20 will be described with reference to FIG. 5.

Figure 10:
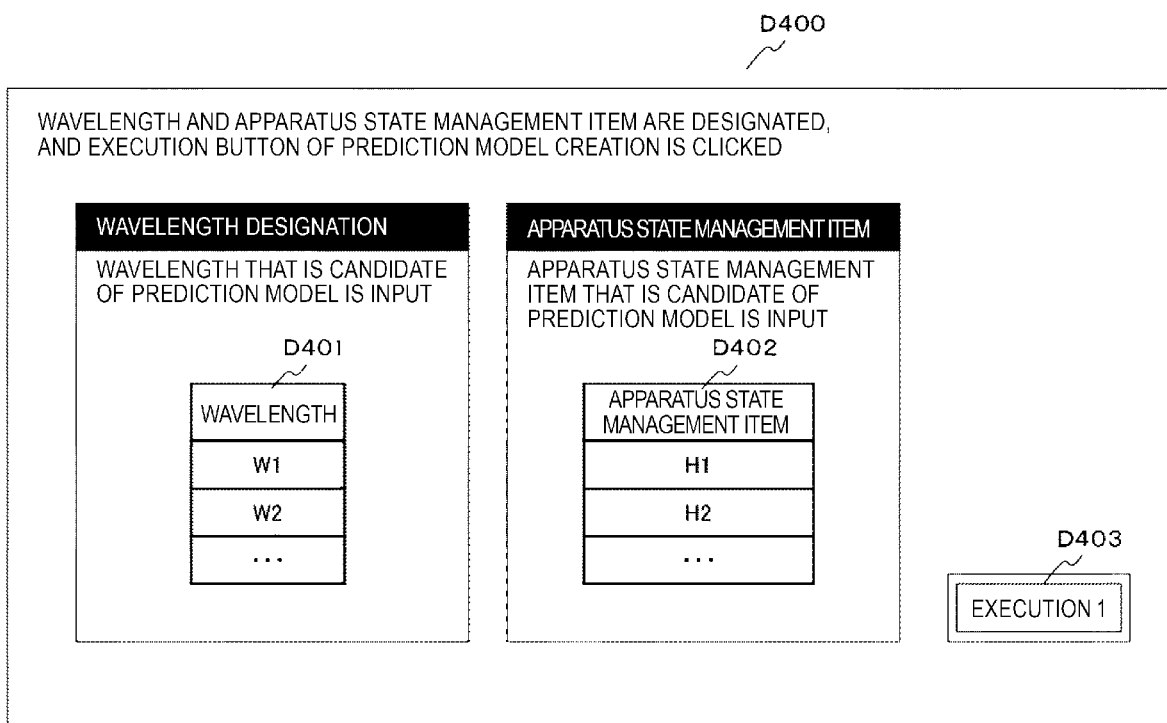
FIG. 10 is a view illustrating an input screen of analysis processing of the data analysis device.

When the apparatus administrator inputs a wavelength (D401) that is an analysis target and an apparatus state management item (D402) on a display screen (D400) as illustrated in FIG. 10, and instructs execution of analysis processing (D403), the analysis unit 20 performs the analysis processing.

First, a combination of the wavelength, the apparatus state management item, and the threshold is created based on the input wavelength and the apparatus state management item (S201) and the process after S203 is performed for each combination (S202).

First, a processing history that is an analysis target is stratified into two by the apparatus state management item and the threshold (S203), and for each stratified data, a determination coefficient that is strength of the correlation between the spectral monitor value in the wavelength of the evaluation target and the processing result index is calculated (S204).

Furthermore, the evaluation of robustness of the correlation when the threshold is slightly changed (S205), a distance between stratified data (S206), and an evaluation of a regression equation of the stratified data (S207) are calculated for all the combinations (S208), and the combination of the wavelength, the apparatus state management item, and the threshold of the best evaluation is specified (S209). Setting for switching the prediction model with the specified combination and the prediction model data are created and presented to the apparatus administrator in a display screen D500 (see FIG. 11) (S210), and thereby the analysis processing is completed.

Next, details of each step will be described.

In S201, the calculation unit 21 acquires the wavelength and the apparatus state management item input by the apparatus administrator on the display screen 400 illustrated in FIG. 10. For the input apparatus state management item, a candidate of the threshold is set. For example, the candidate of the threshold is set so that values between the maximum value and the minimum value of the apparatus state management item are divided into N (N=5, 10, or the like). All the combinations of the wavelength, the apparatus state management item, and the threshold thereof are created by using the candidate of the threshold, the wavelength, and the apparatus state management item. The created combination is stored in the wavelength section 24b, the apparatus state management item section 24c, and the judgment criterion threshold section 24d of the analysis result data table 24a (see FIG. 7). Each row of the analysis result data table 24a indicates each combination.

In S202, the calculation unit 21 evaluates whether or not the combination is acceptable for all the combinations created. In S201, that is, for each row of the analysis result data table 24a (see FIG. 7). Hereinafter, the wavelength that is the calculation target is described as a wavelength Wi, the apparatus state management item is described as an item Hj, the threshold of the apparatus state management item is described as a threshold HjTk.

In S203, the calculation unit 21 stratifies (divides) data of the processing history data table 23a (see FIG. 6) into two based on the apparatus state management item value section 23d. A value of the item Hj of the apparatus state management item value section 23d is stratified into two of data greater than the threshold HjTk and data less than or equal to the threshold HjTk.

Figure 12A:
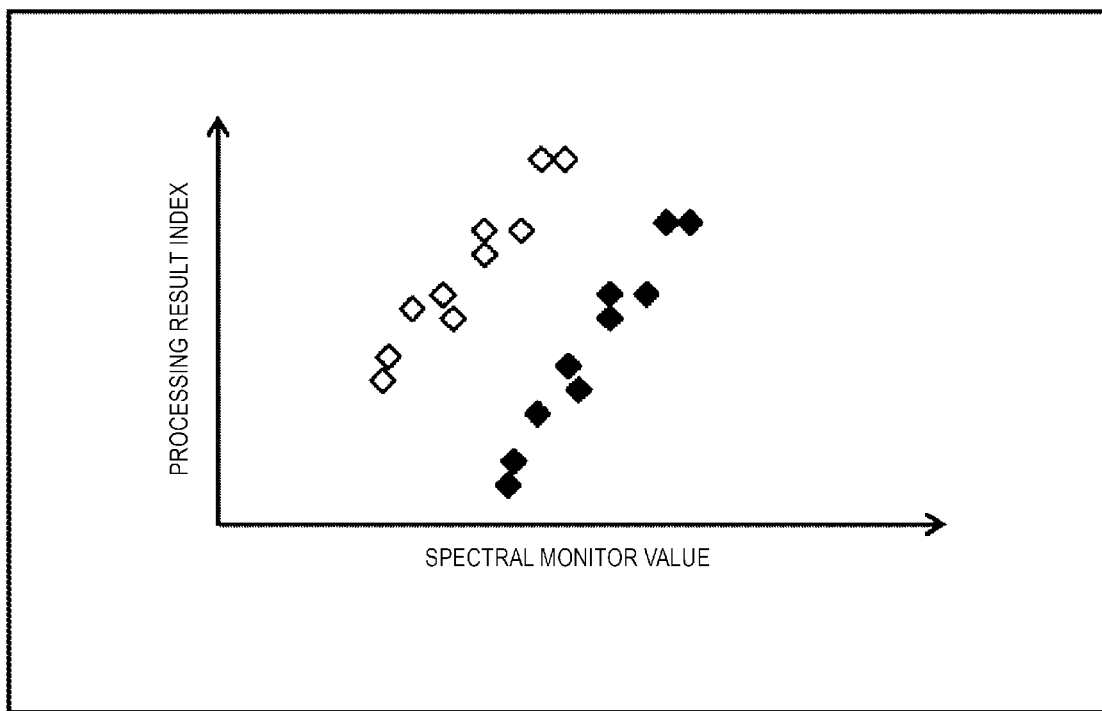
FIG. 12A is a graph illustrating an analysis example of the analysis processing.

In S204, the calculation unit 21 acquires the spectral monitor value and the processing result index in the wavelength Wi for each stratified data of the processing history data table 23a (see FIG. 6). As illustrated in FIG. 12A, data is stratified into two groups. For each group, the determination coefficient indicating the strength of the correlation is calculated and an average of the determination coefficient of the two groups is stored in the determination coefficient section 24e of the analysis result data table 24a as an evaluation index of the combination.

In S205, in a case where the value of the threshold HjTk is slightly changed (for example, increased or decreased by +−5%), the calculation unit 21 evaluates the robustness of the correlation. Specifically, even in the slightly changed threshold, the same process as that of S203 and S204 is performed and the average value of the determination coefficient is calculated. In a case where a difference between the determination coefficient and a determination coefficient of S204 is greater than the predetermined threshold, the robustness of the correlation is evaluated as being low and X is stored in the robustness evaluation section 24f of the analysis result data table 24a.

Figure 12B:
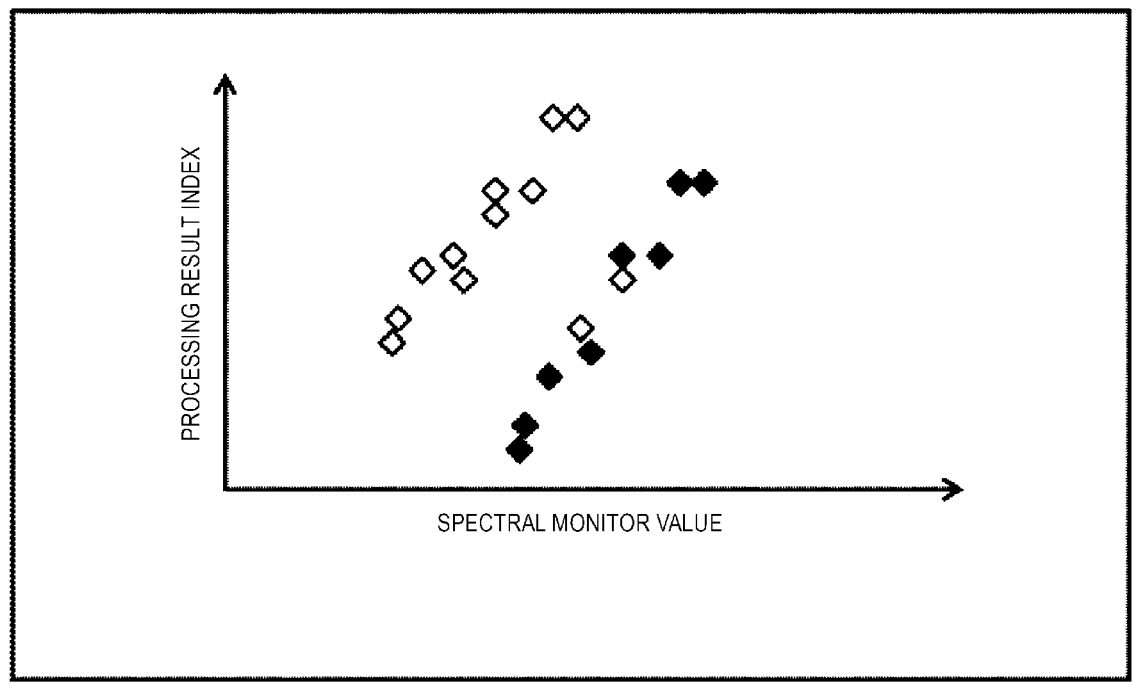
FIG. 12B is a graph illustrating an analysis example of the analysis processing.

In a case where the threshold HjTk is slightly changed, for example, as illustrated in FIG. 12B, when the group of the stratified data is changed, the difference of the determination coefficients increases and the robustness is evaluated as being low. In a case where the difference is small, the robustness is evaluated as being large and O is stored.

The timing of switching of the prediction model may vary due to disturbance depending on the type of the apparatus state management item. Even in such a case, in order to prevent deterioration of the prediction accuracy, a combination with high robustness is specified.

Figure 12C:
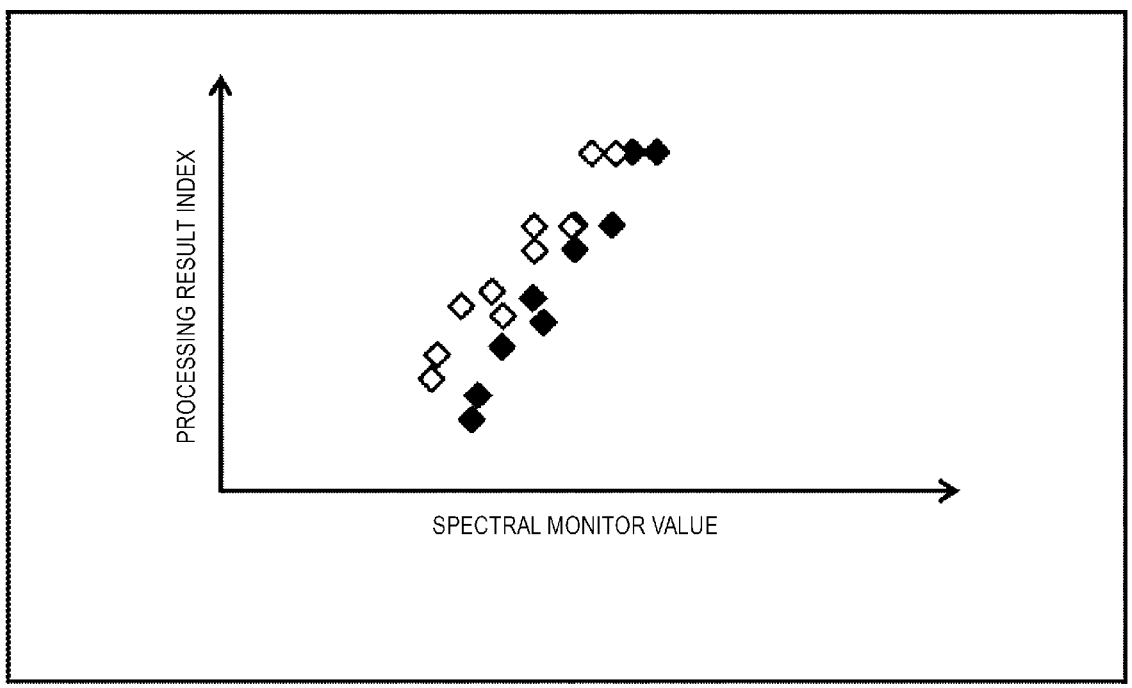
FIG. 12C is a graph illustrating an analysis example of the analysis processing.

In S206, the calculation unit 21 evaluates a distance between the two stratified data. For example, in a case where a Euclidean distance between centers of gravity is calculated and the Euclidean distance is greater than a predetermined threshold, the distance is large, O is stored in the inter-distribution distance evaluation section 24g and if the distance is not large, X is stored therein. An example in which the distance is small is illustrated in FIG. 12C. Since the effect of switching the prediction model is greater as the distance is larger, such a combination is selected.

Figure 12D:
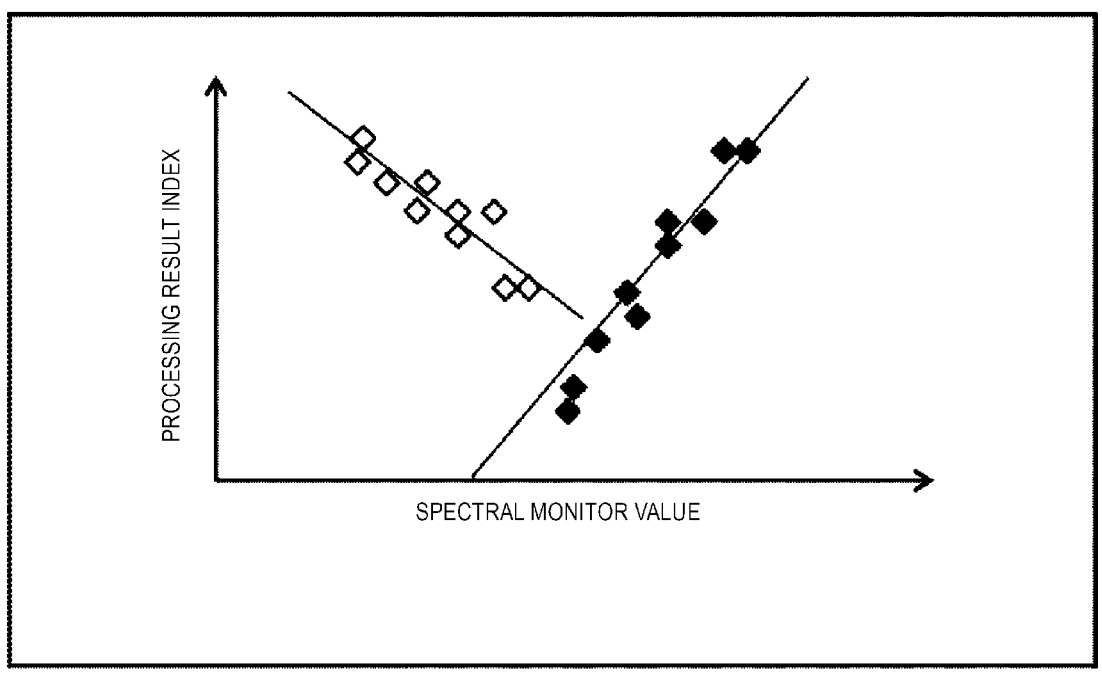
FIG. 12D is a graph illustrating an analysis example of the analysis processing.

In S207, the calculation unit 21 evaluates a coefficient of a regression equation in the two stratified data. Here, a slope of a single regression equation created for the two data is evaluated. In a case where a difference of the slope is smaller than a predetermined threshold, the slope is small and O is stored in the coefficient evaluation section 24h and the slope is not small, X is stored therein. An example in which the difference of the slope is large is illustrated in FIG. 12D. This is for selecting one having a small change in the correlation between the spectral monitor value and the processing result index.

In S208, the calculation unit 21 performs S204 to S207 for all the combinations of the wavelength, the apparatus state management item, and the threshold. In a case where the process is completed, the process proceeds to S209.

In S209, the calculation unit 21 specifies the combination of the wavelength, the apparatus state management item, and the threshold of the best evaluation. Specifically, a combination is specified such that the value of the determination coefficient section 24e has the largest from among the combinations of the wavelength, the apparatus state management item, and the threshold satisfying (which is O) all of the robustness evaluation 24f, the inter-distribution distance evaluation 24g, and the coefficient 24h of the analysis result data table 24a.

Figure 13:
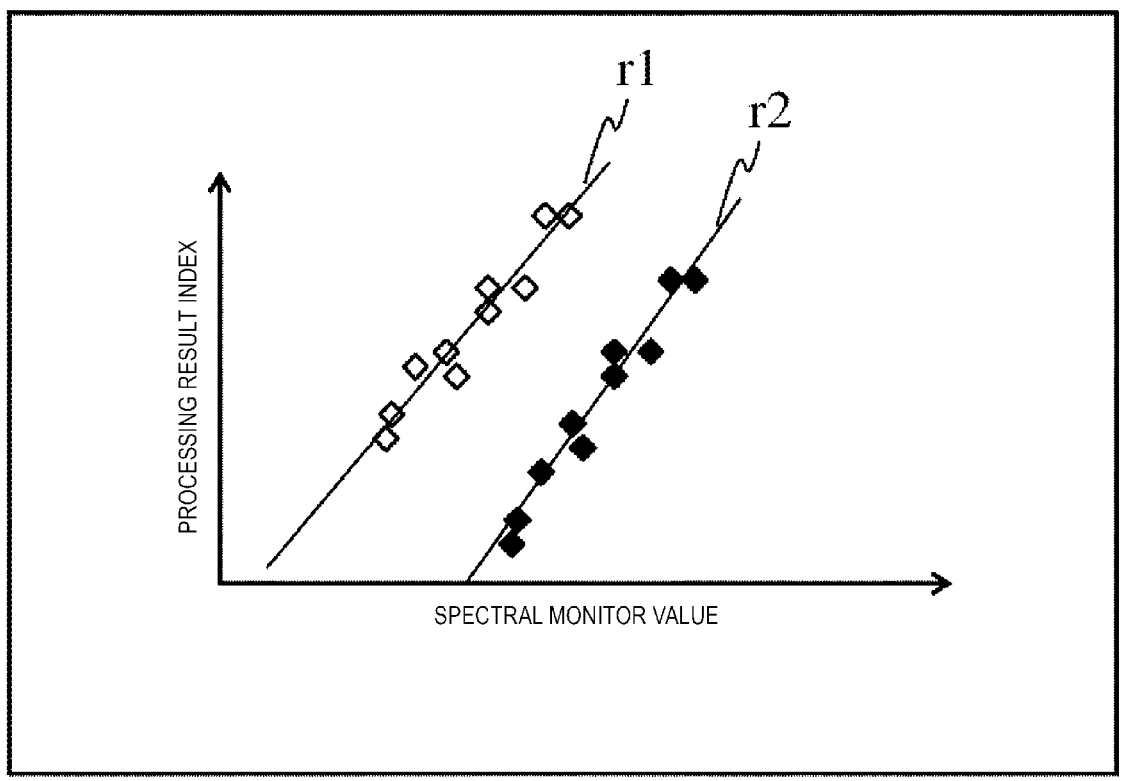
FIG. 13 is a graph illustrating an example of a prediction model.

In S210, the calculation unit 21 displays the combination specified in S209 in the switching item section of the display screen D500. In addition, for the stratified data created in the combination of the wavelength, the apparatus state management item, and the threshold, as illustrated in FIG. 13, each of single regression equations (r1 and r2) is created and the equations are displayed in a prediction model section D502.

The apparatus administrator performs an instruction in D503 (see FIG. 11) in a case where the APC is performed by using the prediction model. In a case where the APC is performed, information displayed on the screens (D501 and D502) illustrated in FIG. 11 is stored in the prediction model storage region 16 and is used for the control.

Although the analysis processing is described above, the stratified data may be further stratified by the same method to make the switching prediction model be three or more.

In this manner, the apparatus administrator can easily specify the apparatus state management item used for switching the prediction model and the threshold that is the judgment criterion.

As described above, the plasma processing apparatus 1 (analysis unit 20) of the example can improve the prediction accuracy of the processing result index by switching the prediction model according to the apparatus state. Specifically, the plasma processing unit 11 that performs the plasma processing of the wafer (sample) and the control unit 13 that controls the plasma processing are provided, and the control unit 13 selects one of the plurality of the prediction models for predicting the result of the plasma processing based on the state of the plasma processing unit 11, and predicts the result of the plasma processing using the selected prediction model. In addition, the apparatus state management item for switching the prediction model and the threshold that is the judgment criterion can also be created from the processing history. Therefore, it is possible to further control the variation to be small in the processing result index when the APC is performed.

Moreover, in the example, the apparatus administrator instructs to specify the apparatus state management item and the threshold for model switching and to instruct the creation of the prediction model, but a configuration to specify an item in the apparatus state management item and the threshold, and create the prediction model may be provided at the step in which data of the processing history is accumulated.

Figure 14:
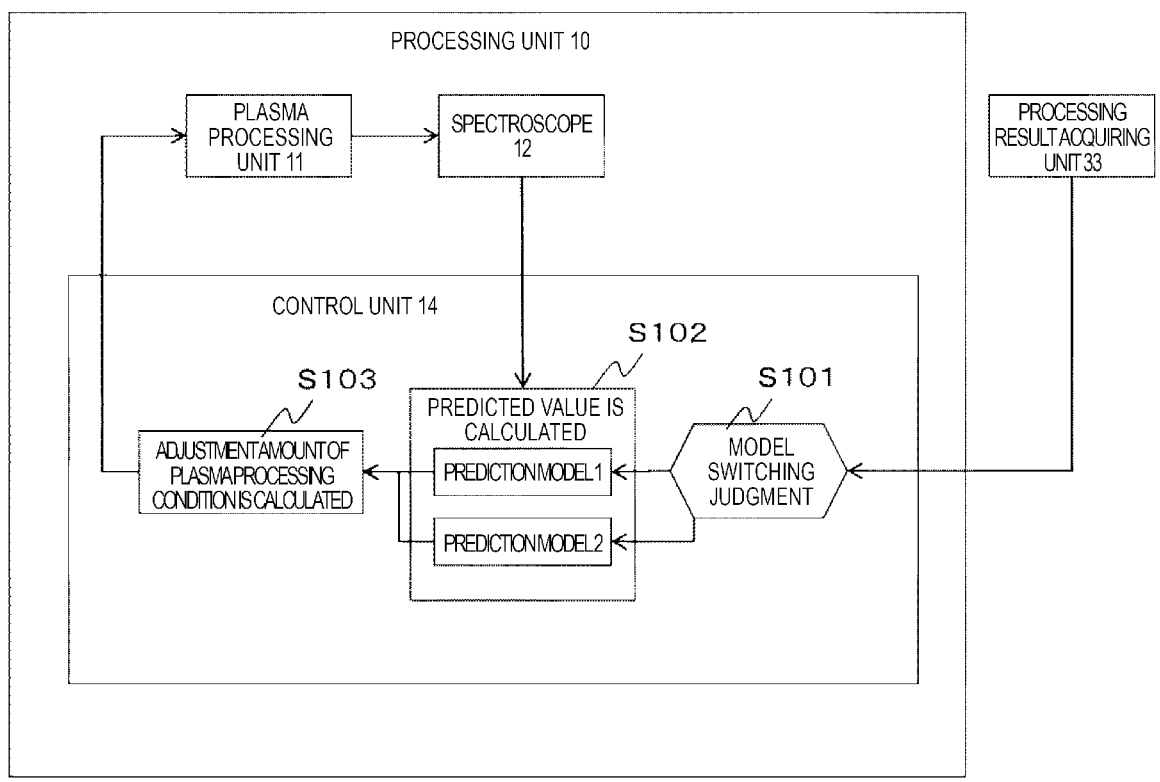
FIG. 14 is a diagram of a configuration for explaining prediction and control processing of another example.

In addition, as illustrated in FIG. 14, the switching judgment (S101) of the prediction model may be performed according to the value of the processing result index acquired from the processing result acquiring unit 33.

Specifically, a plasma processing apparatus 1 having a processing unit 10 illustrated in FIG. 14 includes a spectroscope 12 that measures light emission in a chamber 111 performing plasma processing, and a processing result acquiring unit 33 that acquires an index of a result of the plasma processing from an inspection device (not illustrated). A control unit 13 switches the prediction model based on the index of the result of plasma processing acquired by the processing result acquiring unit 33, inputs the spectroscopic data into the switched prediction model, and predicts the result of the plasma processing.

In addition, it is also possible to sequentially calculate a prediction error of the prediction model and perform a switching judgment (S101) of the prediction model according to a size of the prediction error.

Figure 15:
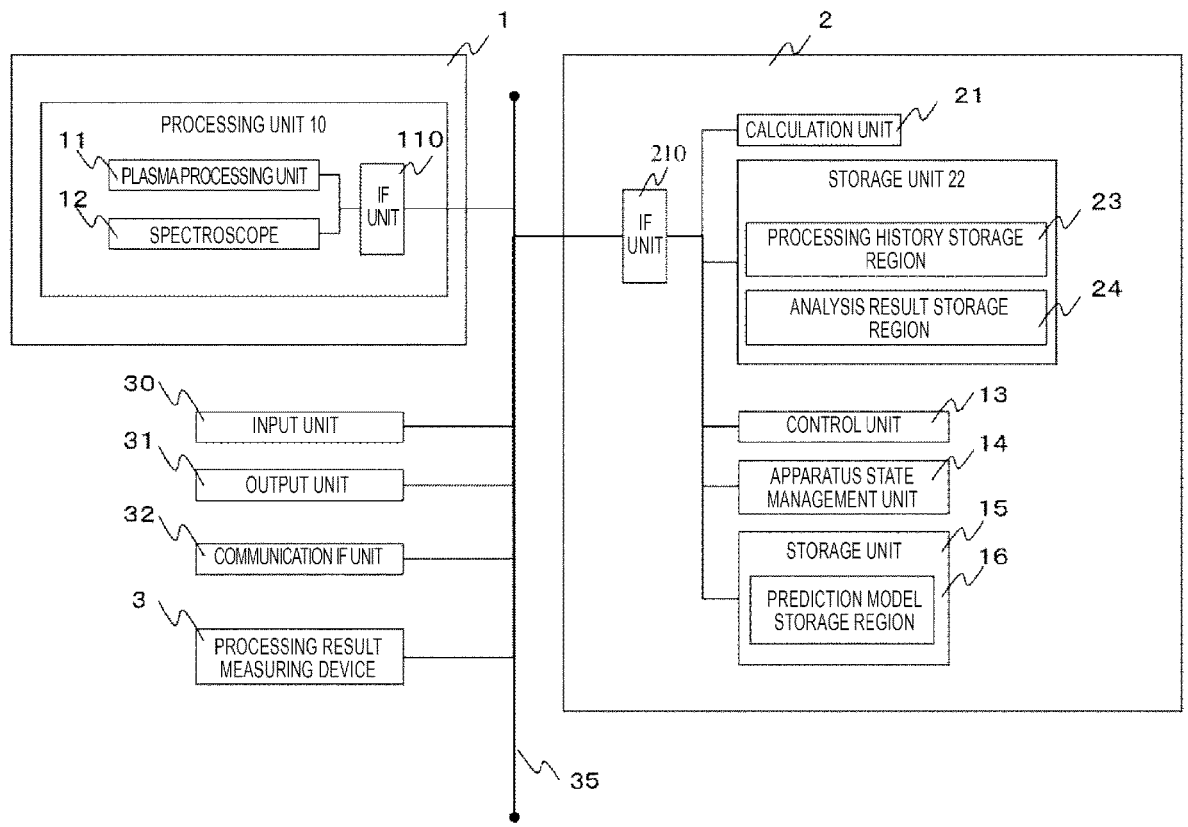
FIG. 15 is a block diagram illustrating a schematic configuration of a plasma processing system of another example.

Alternatively, as illustrated in FIG. 15, the control unit 13, the apparatus state management unit 14, and the storage unit 15 which are positioned in the processing unit 10 in FIG. 1 may be moved to a system connected via a network and the prediction and control may be performed on the system.

Specifically, in the plasma processing system illustrated in FIG. 15, the plasma processing apparatus 1 including the processing unit 10 and a processing unit 2 are connected via a network 35. The processing unit 10 includes a plasma processing unit 11 that plasma-processes and machines the wafer 114 and a spectroscope 12 that measures light emission in the chamber 111 of the plasma processing unit 11. In addition, the processing unit 2 includes the control unit 13 that controls the plasma processing in the plasma processing unit 11 and the apparatus state management unit 14 that holds a management value indicating the state of the plasma processing unit 11.

The control unit 13 includes a plurality of the prediction models for predicting a result of the plasma processing, switches the prediction model based on a threshold of the management value held in the apparatus state management unit 14, and inputs the spectroscopic data into the switched prediction model to predicts the result of the plasma processing.

According to the example, it is possible to accurately predict the processing result index following a change in a state of the plasma processing apparatus.

What is claimed is:

1. A semiconductor device manufacturing system comprising:
    a plasma processing unit that performs plasma processing of a sample;
    a control unit connected via a network interface with the plasma processing unit and configured to control the plasma processing performed by the plasma processing unit on the sample; and
    a state manager coupled to the control unit and configured to store a management value indicating a state of the plasma processing unit,
    wherein the control unit is configured to
        select one of a plurality of prediction models for predicting a result of the plasma processing for each of a plurality of divided data of the management value;
        predict the result of the plasma processing by using the selected prediction model selected for each said divided data; and
        cause the plasma processing unit to process the sample based on the selected prediction model selected for each said divided data, and
    wherein the divided data is data divided based on a threshold of the management value.

* * * * *